(12) United States Patent
Lee et al.

(10) Patent No.: US 9,184,732 B2
(45) Date of Patent: Nov. 10, 2015

(54) APPARATUS AND METHOD FOR GENERATING VIBRATION BASED ON SOUND CHARACTERISTICS

(71) Applicant: Samsung Electronics Co., Ltd., Gyeonggi-do (KR)

(72) Inventors: Eun-Hwa Lee, Gyeonggi-do (KR); Jeong-Seok Lee, Gyeonggi-do (KR); Yu-Dong Bae, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 370 days.

(21) Appl. No.: 13/724,604

(22) Filed: Dec. 21, 2012

(65) Prior Publication Data

US 2013/0163785 A1    Jun. 27, 2013

(30) Foreign Application Priority Data

Dec. 27, 2011    (KR) .................. 10-2011-0143652

(51) Int. Cl.
*H04R 25/00* (2006.01)
*H03J 7/00* (2006.01)
*H04R 3/14* (2006.01)
*H04R 17/08* (2006.01)

(52) U.S. Cl.
CPC ... *H03J 7/00* (2013.01); *H04R 3/14* (2013.01); *H04R 17/08* (2013.01); *H04R 2430/03* (2013.01); *H04R 2499/11* (2013.01); *H04S 2400/07* (2013.01)

(58) Field of Classification Search
CPC ...... H04R 1/1066; H04R 1/26; H04R 5/0335; H04R 3/14; H04R 17/00; H04R 5/033; H03J 7/00; H02K 33/16; H02P 25/028; G06F 1/1626; G06F 3/016; G06F 1/1637; H04M 1/00; H04H 5/00
USPC .......... 381/103, 309, 384, 99, 380, 370, 378, 381/107, 191, 162; 310/25; 704/500; 455/567, 550, 557; 345/156
See application file for complete search history.

(56) References Cited

U.S. PATENT DOCUMENTS

| | | | | |
|---|---|---|---|---|
| 4,152,071 | A * | 5/1979 | Podgorski | 356/473 |
| 8,175,302 | B2 * | 5/2012 | Tanghe et al. | 381/191 |
| 2009/0204413 | A1 * | 8/2009 | Sintes et al. | 704/500 |
| 2010/0096936 | A1 * | 4/2010 | Bae et al. | 310/25 |
| 2012/0250889 | A1 * | 10/2012 | Millett | 381/107 |

FOREIGN PATENT DOCUMENTS

KR      100668490      1/2007

* cited by examiner

*Primary Examiner* — Vivian Chin
*Assistant Examiner* — Ubachukwu Odunukwe
(74) *Attorney, Agent, or Firm* — The Farrell Law Firm, P.C.

(57) ABSTRACT

A method and apparatus for generating vibration based on sound characteristics in a mobile terminal are provided. The method includes converting audio data into an audio signal upon generation of a sound play request; determining whether to generate vibration based on a sound volume of the audio signal; setting an actuator to be driven for the audio signal among at least two actuators based on frequency distribution characteristics of the audio signal if it is determined upon determining to generate the vibration; and driving the actuator being set for the audio signal when outputting the audio signal.

14 Claims, 7 Drawing Sheets

APPARATUS AND METHOD FOR GENERATING VIBRATION BASED ON SOUND CHARACTERISTICS

PRIORITY

This application claims priority under 35 U.S.C. §119(a) to a Korean Patent Application filed in the Korean Intellectual Property Office on Dec. 27, 2011 and assigned Serial No. 10-2011-0143652, the entire content of which is incorporated herein by reference.

BACKGROUND OF THE INVENTION

1. Field of the Invention

The present invention relates generally to an apparatus and method for generating vibration in a mobile terminal, and more particularly, to an apparatus and method for generating vibration in a mobile terminal based on sound characteristics.

2. Description of the Related Art

A mobile terminal refers to an apparatus that allows a user to perform mobile communication. Mobile terminals typically provide a vibration function to inform the user of incoming call or message reception.

As mobile terminals have increasingly been implemented in the form of multimedia devices that provide composite functions, such as capturing of still or moving images, play of music or moving image files, games, and reception of broadcasting, vibration is used for various purposes as well as for indicating incoming call or a message reception. For example, a vibration function is provided in association with various functions, such that vibration may be generated when the user listens to music or plays a game with a mobile terminal.

However, conventional vibration functions in conventional mobile terminals merely focus on generating a monotonous vibration. Accordingly, various and dynamic vibrations cannot be generated in conventional mobile terminals.

Vibration in conventional mobile terminals may produce various resonance effects according to the arrangement and mounting position of an actuator. In the conventional mobile terminal, the actuator is mounted without consideration of the arrangement position of the actuator, and thus the resonance effect cannot be sufficiently provided to the user.

SUMMARY OF THE INVENTION

Accordingly, the present invention is provided to address at least the above-described problems and provide at least the advantages described below. An aspect of the present invention provides an apparatus and method for generating vibration based on sound characteristics in a mobile terminal, in which various vibrations may be generated according to sound characteristics when sound is output for music play, a game, and so forth, beyond simple vibration generation.

The present invention also provides an apparatus and method for generating vibration based on sound characteristics in a mobile terminal, in which an actuator is arranged and mounted at a position which allows a user to sufficiently feel a vibration effect, thus conveying a dynamic feeling to the user when vibration is generated.

According to an aspect of the present invention, an apparatus for generating vibration based on sound characteristics in a mobile terminal is provided. The apparatus includes at least two actuators including first and second actuators for generating vibration, an actuator driver for driving the actuators according to an actuator drive signal, an audio unit for converting audio data into an audio signal upon generation of a sound play request and outputting the audio signal, and a controller for determining whether to generate vibration based on a sound volume of the audio signal, setting an actuator to be driven for the audio signal among the at least two actuators based on frequency distribution characteristics of the audio signal upon determining to generate the vibration, and generating the actuator drive signal for driving the actuator being set for the audio signal when the audio signal is output.

According to another aspect of the present invention, a method of generating vibration based on sound characteristics in a mobile terminal is provided. The method includes converting audio data into an audio signal upon generation of a sound play request, determining whether to generate vibration based on a sound volume of the audio signal, setting an actuator to be driven for the audio signal among at least two actuators based on frequency distribution characteristics of the audio signal upon determining to generate the vibration, and driving the actuator being set for the audio signal when outputting the audio signal.

BRIEF DESCRIPTION OF THE DRAWINGS

The above and other features and advantages of embodiments of the present invention will be more apparent from the following detailed description taken in conjunction with the accompanying drawings, in which.

DETAILED DESCRIPTION OF EMBODIMENTS OF THE PRESENT INVENTION

Hereinafter, embodiments of the present invention are described with reference to the accompanying drawings. In the following description, specific details such as detailed configuration and components are merely provided to assist the overall understanding of embodiments of the present invention and predetermined changes or modifications can be made without departing from the scope of the present invention. In the following description, a detailed description of known functions or configurations incorporated herein will be omitted when such a description may unnecessarily obscure the subject matter of the present invention.

Embodiments of the present invention include an apparatus and method for generating vibration based on sound characteristics in a mobile terminal. In particular, embodiments the present invention include an apparatus and method for generating vibration based on sound characteristics such as the frequency or volume of sound in a mobile terminal in which at least two actuators are arranged and mounted. For example, a mobile terminal according to an embodiment of the present invention may include an apparatus for generating vibration that generates vibration based on the arranging and mounting position of an actuator and sound characteristics, thereby providing dynamic vibration to a user. Embodiments of the present invention are applicable to any device that device can output sound and can be mounted with the apparatus for generating vibration. In the following description, the construction and operating principle of embodiments of the present invention will be described by using an example where an apparatus for generating vibration is provided in a mobile terminal. The mobile terminal may be, for example, an electronic notepad, notebook computer, a cellular phone, a Personal Digital Assistant (PDA), a smart phone, or a smart pad, and as shown in FIG. 1, two or more actuators may be arranged and mounted in the mobile terminal.

Figure 1:
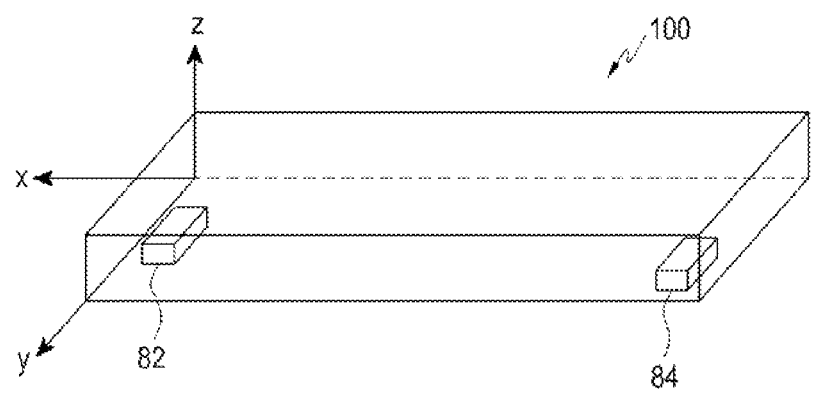
FIG. 1 is a diagram illustrating an arrangement and mounting positions of actuators in a mobile terminal according to an embodiment of the present invention.

FIG. 1 is a diagram illustrating an arrangement and mounting positions of actuators in a mobile terminal according to an embodiment of the present invention.

Referring to FIG. 1, at least two actuators 82 and 84 are arranged and mounted in the mobile terminal 100 according to an embodiment of the present invention. In the present example, a first actuator 82 and a second actuator 84 are mounted in the mobile terminal 100. An actuator generally refers to an device operates with an energy source, such as current, operating hydraulic pressure, or voltage, and converts provided energy into motion, for example, vibration, to operate.

According to an embodiment of the present invention, the first and second actuators 82 and 84 are arranged and mounted at a position at which a difference between vibration forces the user feels on both hands when holding the mobile terminal 100 by the both hands is at least 3 dB. In FIG. 1, the first and second actuators 82 and 84 are arranged at both ends with respect to a major axis (i.e., the x-axis direction in FIG. 1) of the mobile terminal 100. When the user holds the both ends of the mobile terminal 100 with respect to the major axis, the intensity of vibration that the first actuator 82 generates and the user feels on a hand near the first actuator 82 is at least two times as much as the intensity of vibration which the second actuator 84 generates and the user feels on the hand near the second actuator 84.

According to an embodiment of the present invention, the mobile terminal 100 equipped with the first and second actuators 82 and 84 controls, based on sound characteristics, the first and second actuators 82 and 84 to generate vibration corresponding to the sound characteristics.

Figure 2:
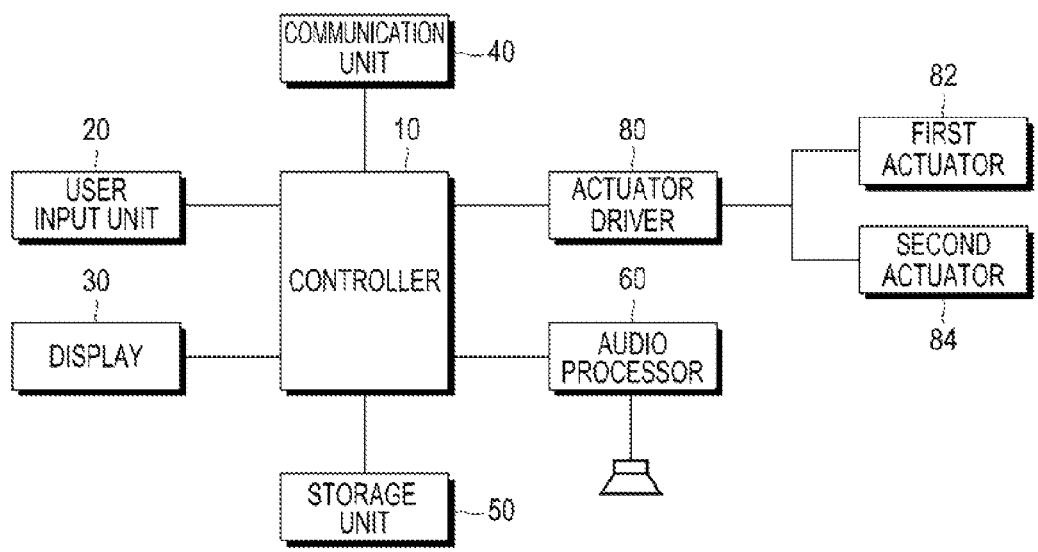
FIG. 2 is a block diagram illustrating a mobile terminal according to an embodiment of the present invention.

FIG. 2 is a block diagram illustrating a mobile terminal according to an embodiment of the present invention.

Referring to FIG. 2, the mobile terminal 100 includes a controller 10, a user input unit 20, a display 30, a communication unit 40, a storage unit 50, an audio processor 60, an actuator driver 80, the first actuator 82, and the second actuator 84.

The controller 10 controls overall operations of the mobile terminal 100 according to an embodiment of the present invention. In particular, according to an embodiment of the present invention, in sound playback, based on sound characteristics, for example, the frequency or volume of an audio signal corresponding to sound (i.e., based on characteristics of the audio signal), the controller 10 determines a vibration generation period of the audio signal, and the controller 10 sets an actuator corresponding to the vibration generation period. The controller 10 provides a control signal for driving the first and second actuators 82 and 84 to the actuator driver 80 according to the actuator that is set to correspond to the vibration generation period in a period of the audio signal. The controller 10 performs a control operation for music playback or game execution according to a request or a user input received through the user input unit 20, for example, a music play request or a user input generated in game execution.

The user input unit 20 may include a keypad or a touch screen having a plurality of keys for inputting various numbers, characters, and symbols, and various user commands. The user input unit 20 receives a music play request or user input generated during game execution and forwards the received input to the controller 20 according to an embodiment of the present invention.

The display 30 may be implemented with, for example, a Liquid Crystal Display (LCD), or an Organic Electro Luminescence Display (OELD), and displays a screen corresponding to execution of various functions such as music playback or game execution under control of the controller 10.

The communication unit 40 performs wired and/or wireless communication, and performs voice communication and/or data communication under control of the controller 10. Through the communication unit 40, music or a game may be downloaded from an external server.

The storage unit 50 may include a non-volatile memory implemented with, for example, a flash memory or a hard disk, and stores data or programs necessary for operations of the mobile terminal 100. In particular, the storage unit 50 stores music data or a game program and stores setting information for the first and second actuators 82 and 84 based on sound characteristics, according to an embodiment of the present invention.

The audio processor 60 converts sound that is output in music playback or game execution, i.e., converts audio data into an analog audio signal, and outputs the analog audio signal through a speaker 72, under control of the controller 10.

The actuator driver 80 forwards a drive signal for driving the first and second actuators 82 and 84 or a break signal for stopping driving of the first and second actuators 82 and 84 to the first and second actuators 82 and 84, under control of the controller 10.

The first and second actuators 82 and 84 are driven or stopped according to the drive signal or the break signal of the actuator driver 80. The first and second actuators 82 and 84 may be of various types depending on an energy source, such as a vibration motor, a piezo, or an electroactive polymer, or depending on an operating scheme. The first and second actuators 82 and 84 may be of the same type or different types. Resonance frequencies for vibration generation of the first and second actuators 82 and 84 may be the same as or different from each other. The first and second actuators 82 and 84 may have the same or different response characteristics. For example, one of the first and second actuators 82 and 84 may have faster response characteristics and the other may have slower response characteristics. The actuator having the faster response characteristics may be an actuator having a response time of 10 ms or less. The response time is a time taken for the actuator to respond, and may be a time required for the intensity of vibration to reach 50% of a maximum vibration intensity or a time required for the intensity of vibration to be reduced to 50% from the maximum vibration intensity.

A method for generating vibration based on sound characteristics in a mobile terminal according to an embodiment of the present invention is described as follows.

Figure 3:
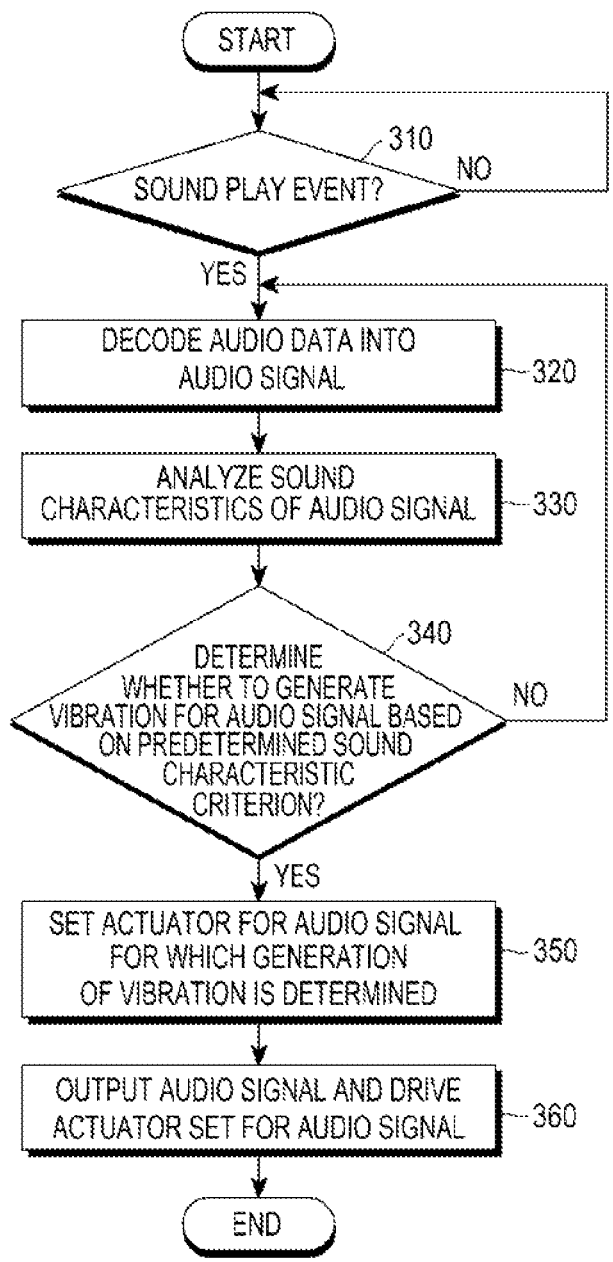
FIG. 3 is a flowchart illustrating a method for generating vibration based on sound characteristics in a mobile terminal according to an embodiment of the present invention.

FIG. 3 is a flowchart illustrating a method for generating vibration based on sound characteristics in a mobile terminal according to an embodiment of the present invention.

Referring to FIG. 3, the mobile terminal 100 determines whether a sound play event is generated in step 310. For example, the mobile terminal 100 may determine that the sound play event is generated if music playback starts in response to a music play event of the user or sound playback starts in game execution.

Upon generation of the sound play event, the mobile terminal 100 decodes audio data for sound playback into an analog audio signal, in step 320. The mobile terminal 100 analyzes sound characteristics of the audio signal in step 330. For example, the mobile terminal 100 may analyze the frequency and/or volume of the audio signal.

The mobile terminal 100 determines whether to generate vibration for the audio signal according to a predetermined sound characteristic criterion in step 340. For example, if the predetermined sound characteristic criterion is a predetermined reference frequency, the mobile terminal 100 may determine whether to generate vibration according to whether a frequency of a period of the audio signal is higher or lower than the reference frequency. If the predetermined sound characteristic criterion is a predetermined reference volume, the mobile terminal 100 may determine whether to generate vibration according to whether the volume of the audio signal of the period of the audio signal is higher or lower than the reference volume.

Upon a determination not to generate vibration in step 340, the operation returns to step 320. However, upon determining to generate vibration in step 340, the mobile terminal 100 sets an actuator for the audio signal in step 350. For example, the mobile terminal 100 sets the first actuator 82 to be driven in a period in which the frequency is lower than the predetermined reference frequency; in a period in which the frequency is higher than the predetermined reference frequency, the mobile terminal 100 sets the second actuator 84 to be driven. The mobile terminal 100 may also set the second actuator 84 to be driven in the period in which the frequency is lower than the predetermined reference frequency; in the period in which the frequency is higher than the predetermined reference frequency, the mobile terminal 100 may set the first actuator 82 to be driven. The mobile terminal 100 may also set no actuator to be driven in the period in which the frequency is lower than the predetermined reference frequency; in the period in which the frequency is higher than the predetermined reference frequency, the mobile terminal 100 may set one of or both of the first and second actuators 82 and 84 to be driven. The mobile terminal 100 may set one of or both of the first and second actuators 82 and 84 to be driven according to whether the volume of the audio signal of the period of the audio signal is higher or lower than the predetermined reference volume.

Once actuator setting is completed in this way, the mobile terminal 100 outputs the audio signal and drives the actuator that is set for the audio signal to generate vibration, in step 360. The vibration generation time instant may be set as a time instant at which a sound volume change is at least 50%. The vibration generation time instant may be set as a time instant at which sound volume is reduced by at least 50%, and the mobile terminal 100 may more quickly stop generation of vibration by forwarding the break signal to the actuator to stop generation of vibration.

By using this method for generating vibration based on sound characteristics in the mobile terminal 100, the user is able to feel dynamic vibration according to sound characteristics of an audio signal. In the preceding example according to an embodiment of the present invention, the determination of whether to generate vibration is performed according to sound volume and frequency characteristics of the audio signal, and an actuator to be vibrated is set according to sound volume and frequency characteristics of the audio signal for which generation of vibration is determined. However, according to another embodiment of the present invention, by using one of the sound volume and frequency of the audio signal as a criterion, a determination of whether to generate vibration may be performed and the actuator to be vibrated may be set.

A method for generating vibration based on sound characteristics by determining whether to generate vibration based on a sound volume of an audio signal and setting an actuator based on a frequency distribution of the audio signal for which vibration is to be generated, according to another embodiment of the present invention, is described as follows.

Figure 4:
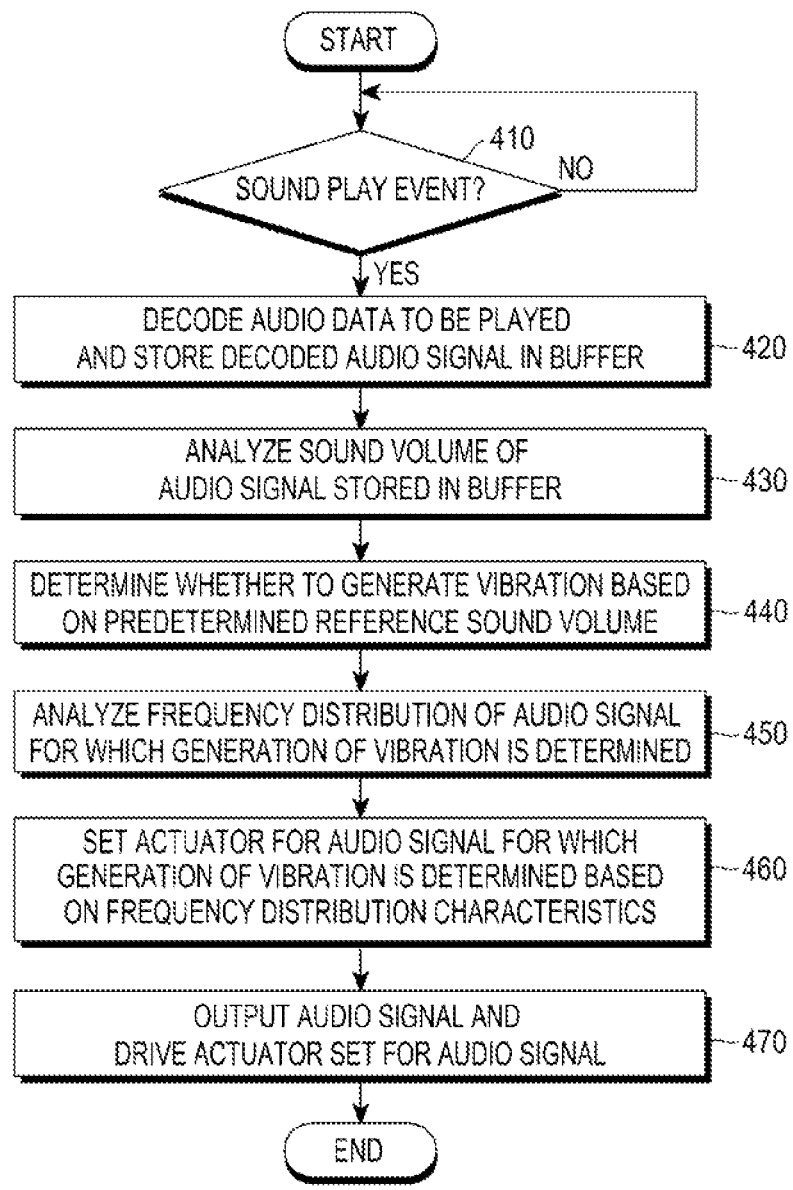
FIG. 4 is a flowchart illustrating a method for generating vibration based on sound characteristics in sound playback according to an embodiment of the present invention.

FIG. 4 is a flowchart illustrating a method for generating vibration based on sound characteristics in a mobile terminal according to another embodiment of the present invention.

Referring to FIG. 4, the mobile terminal 100 determines whether the user inputs the music play request or game execution request. The user may request playback of desired music or execution of a desired game through the user input unit 20.

The mobile terminal 100 decodes audio data to be played into an analog audio signal upon receiving the music play or game execution request, and stores the decoded audio signal in a buffer at predetermined time intervals Δt, in step 420. The mobile terminal 100 analyzes the sound volume of the audio signal stored in the buffer in step 430.

Figure 5:
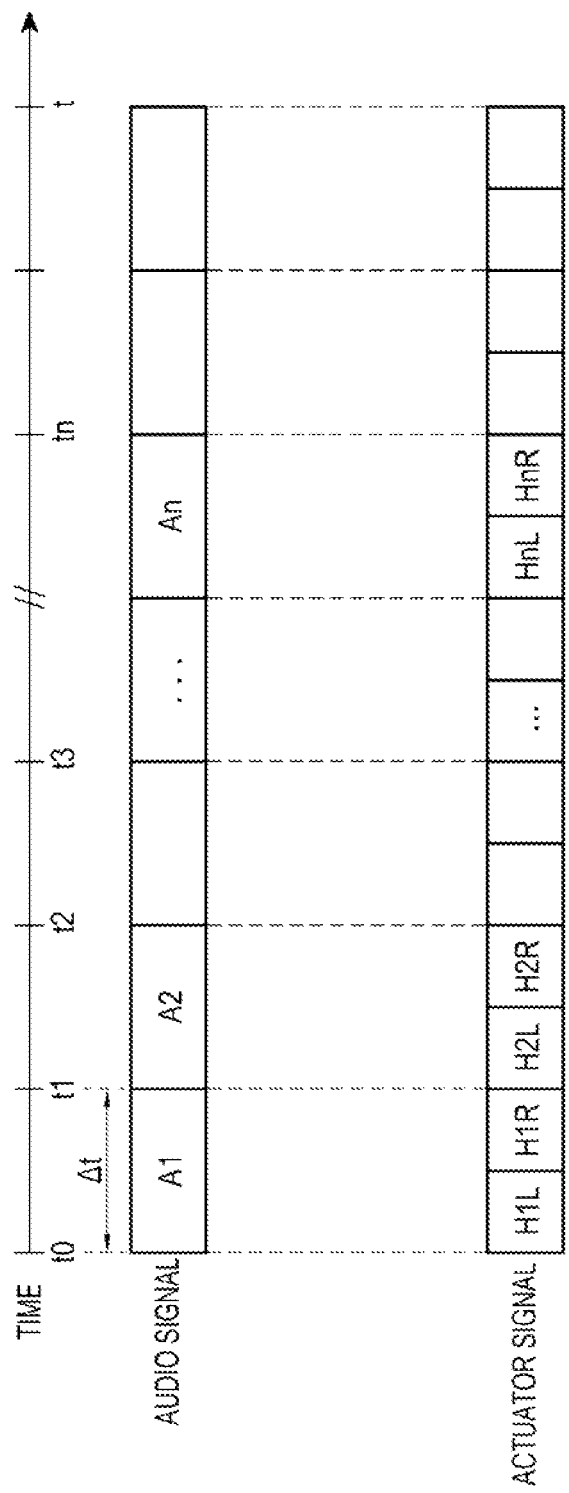
FIG. 5 is a diagram illustrating an audio signal and an actuator drive signal according to an embodiment of the present invention.

FIG. 5 is a diagram illustrating audio signals and actuator drive signals according to an embodiment of the present invention.

Referring to FIG. 5, audio signals are sequentially stored for a time Δt in the buffer according to an embodiment of the present invention, and audio signals A1 through An are sequentially stored at the time intervals Δt from t0 to tn. For example, from t0 to t1, the audio signal A1 is stored, and from t1 to t2, the audio signal A2 is stored. For example, the mobile terminal 100 analyzes the sound volume of the audio signal A1, when the audio signal A1 is stored in the buffer as shown in FIG. 5.

Upon analyzing the sound volume of the audio signal stored in the buffer, the mobile terminal 100 determines whether to generate vibration for the audio signal stored in the buffer based on the sound volume in step 440. For example, if the sound volume of the audio signal A1 stored in the buffer is greater than a predetermined sound volume, then the mobile terminal 100 determines to generate vibration for the audio signal A1; otherwise, unless the sound volume of the audio signal A1 stored in the buffer is greater than the predetermined sound magnitude, then the mobile terminal 100 determines not to generate vibration for the audio signal A1.

Figure 6:
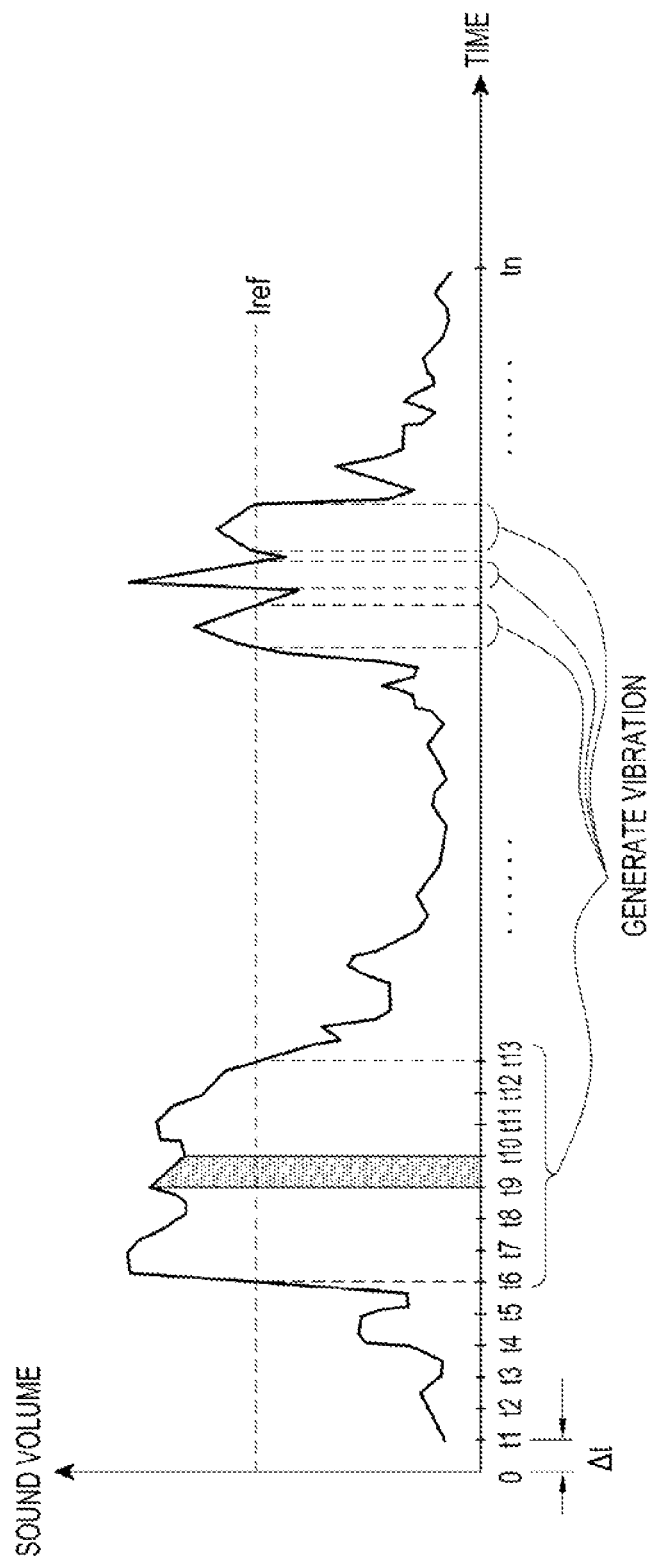
FIG. 6 is a diagram illustrating a sound volume in each period of an audio signal according to an embodiment of the present invention.

FIG. 6 is a diagram illustrating a sound volume of an audio signal according to an embodiment of the present invention.

In FIG. 6, a horizontal axis indicates time and a vertical axis indicates a sound volume of an audio signal. In FIG. 6, sound volumes of audio signals stored in the buffer from t0 to tn are shown. Referring to FIG. 6, the mobile terminal 100 determines whether to generate vibration for an audio signal whose sound volume is greater than a predetermined sound volume Iref. For example, in FIG. 6, sound volumes of audio signals A7 through A13 stored in the buffer from t6 to t13 are greater than the predetermined sound volume Iref, and the mobile terminal 100 determines to generate vibration for the respective audio signals A7 through A13 stored in the buffer.

Upon determining that an audio signal stored in the buffer is an audio signal for which vibration is to be generated, the mobile terminal 100 analyzes a frequency distribution of the audio signal stored in the buffer in step 450. More specifically, the mobile terminal 100 analyzes the audio signal stored in the buffer to determine how much of the audio signal corresponds to each frequency component.

Figure 7A:
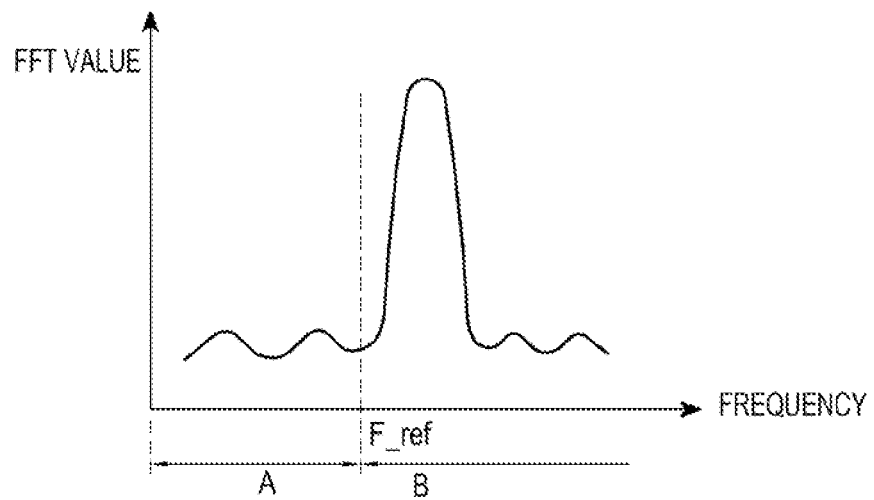
FIGS. 7A and 7B are graphs illustrating frequency distribution in a vibration generation period according to an embodiment of the present invention.
Figure 7B:
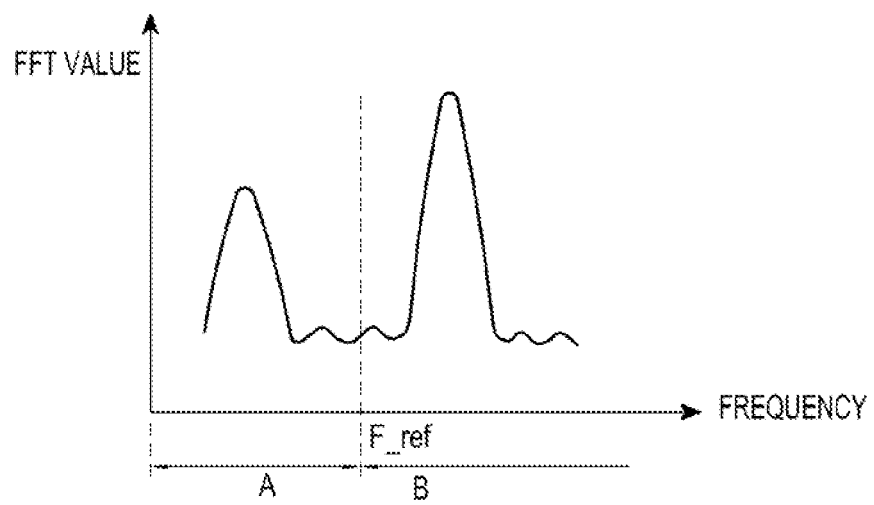

FIGS. 7A and 7B are graphs illustrating a frequency distribution of an audio signal stored in the buffer according to an embodiment of the present invention.

In FIGS. 7A and 7B, a horizontal axis indicates frequency and a vertical axis indicates a Fast Fourier Transform (FFT) value with respect to frequency. Referring to FIGS. 7A and 7B, the mobile terminal 100 performs FFT on a frequency component of the audio signal stored in the buffer to obtain a FFT value, and analyzes a size of the FFT value with respect to frequency to determine a distribution of the frequency component.

After analyzing the distribution of the frequency component, the mobile terminal 100 sets an actuator to be driven for the audio signal based on frequency distribution characteristics in step 460. In this case, as shown in FIG. 5, for the audio signal stored in the buffer, an actuator drive signal is set. For example, the mobile terminal 100 sets an actuator drive signal corresponding to an actuator to be driven for the audio signal stored in the buffer based on whether the audio signal stored in the buffer mainly includes a low-frequency component A or a high-frequency component B with respect to a predetermined reference frequency F_ref. For instance, if the audio signal stored in the buffer mainly includes the high-frequency component B as shown in FIG. 7A, the mobile terminal 100 sets one of the two actuators 82 and 84 corresponding to high frequency, (i.e., the actuator 84), to be vibrated. If the actuators 82 and 84 are arranged to the left and to the right with respect to the major axis of the mobile terminal 100, the mobile terminal 100 may set an actuator drive signal to 'H1R' to vibrate the actuator arranged to the right.

If the audio signal stored in the buffer includes both the low-frequency component A and the high-frequency component B as shown in FIG. 7B, the mobile terminal 100 may set the actuator drive signal to 'H1L' and 'H1R' to vibrate both of the two left and right actuators 82 and 84. Although not shown, if the audio signal stored in the buffer mainly includes the low-frequency component A, the mobile terminal 100 may set the actuator drive signal to 'H1L' to vibrate only the actuator 82 corresponding to low frequency. If the audio signal stored in the buffer does not include either the low-frequency component A or the high-frequency component B, the mobile terminal 100 may set any vibration not to be generated. While two actuators are used in the examples described herein, two or more actuators may be set to vibrate.

After actuator setting for the audio signal stored in the buffer is performed as described above, the mobile terminal 100 outputs the audio signal stored in the buffer and drives the actuator set for the audio signal to generate vibration in step 470. At this time, vibration may be generated simultaneously with output of the audio signal stored in the buffer, and a game play screen or a music play screen may be displayed together.

A vibration stop time instant after vibration generation may be set as a time instant at which sound volume is reduced by at least 50%, and the mobile terminal 100 may more quickly stop generation of vibration by forwarding the break signal to the actuator to stop generation of vibration.

Thus, as described hereinabove, the mobile terminal 100 repeats steps 430 through 470 for audio signals sequentially stored in the buffer, thereby generating vibration together with sound play in music playback or game execution.

Figure 8:
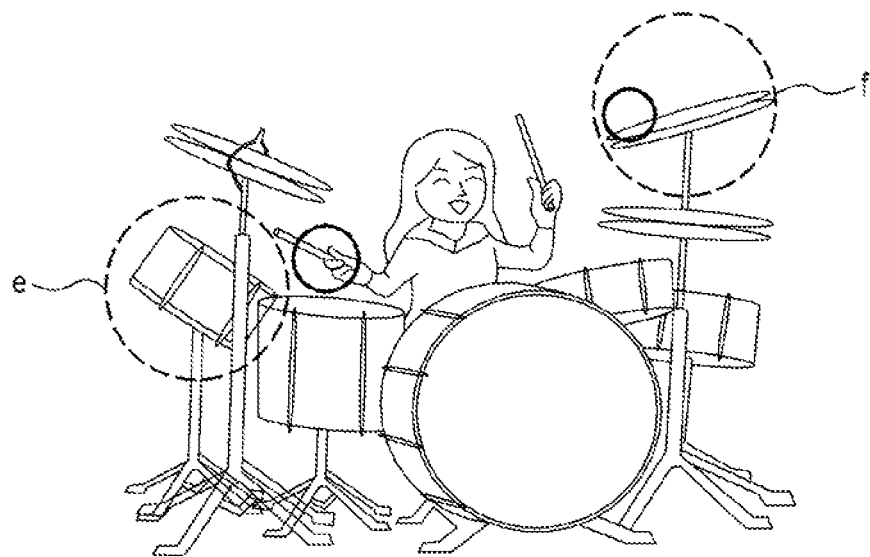
FIG. 8 is a diagram for describing an example in which an actuator is driven in music playback according to an embodiment of the present invention.

FIG. 8 is a diagram illustrating an example in which an actuator is driven in music playback according to an embodiment of the present invention.

Referring to FIG. 8, when music sound to be played is a mixture of sounds of various musical instruments such as a drum and cymbals, a drum sound of a drum e belongs to a low-frequency band and a cymbals sound of cymbals f belongs to a high-frequency band. Therefore, according to the present invention, when the drum sound of the drum e is played, the first actuator 82 corresponding to the low-frequency component A generates vibration; and when the cymbals sound of the cymbals f is played, the second actuator 84 corresponding to the high-frequency component B generates vibration, such that vibration is generated in different positions for different frequencies, thus allowing the user to feel dynamic vibration.

Figure 9A:
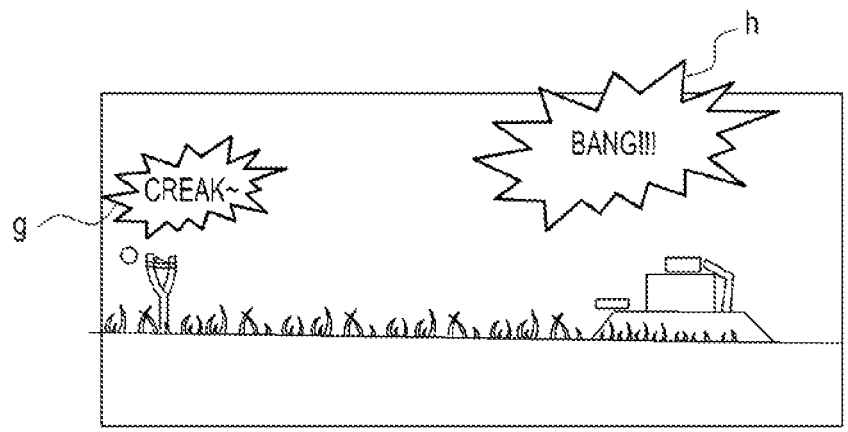
FIGS. 9A and 9B are diagrams for describing an example in which an actuator is driven in game execution according to an embodiment of the present invention.
Figure 9B:
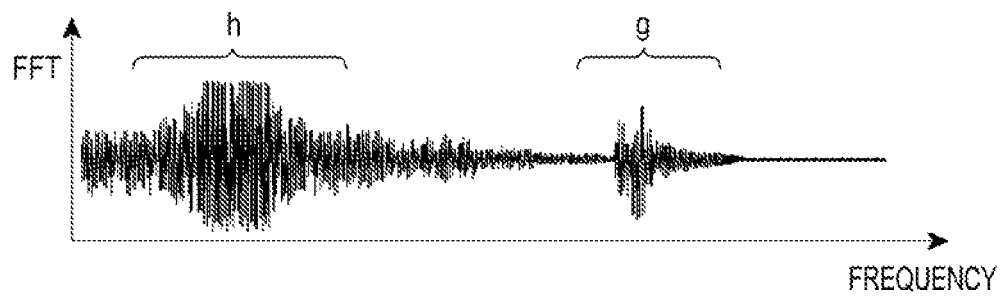

FIGS. 9A and 9B are diagrams illustrating an example in which an actuator is driven in game execution according to an embodiment of the present invention. Referring to FIG. 9A, upon generation of events in game execution, various sounds, such as a first event sound g and a second event sound h, are played for the corresponding events. Audio signals of the sounds for the corresponding events may have different frequency distribution characteristics. Referring to FIG. 9B, an audio signal of a sound corresponding to an event may have frequency distribution characteristics, which, for example, may have a high-frequency band and a narrow bandwidth, like the first event sound g, or may have a low-frequency band and a broad bandwidth, like the second event sound h.

In this case, according to an embodiment of the present invention, when the first event sound g is played, vibration is generated through the first actuator 82, which has faster response characteristics than the second actuator 84. When the second event sound h is played, vibration is generated through the second actuator 84, which has slower response characteristics than the first actuator 82. In this way, vibration corresponding to response characteristics is generated based on frequency distribution characteristics of sounds, thereby allowing the user to feel dynamic vibration.

As is apparent from the foregoing description, by arranging and mounting a plurality of actuators at positions that provide a maximum vibration effect, vibration may be sufficiently provided to the user. According to the embodiments of the present invention, when the mobile terminal outputs sound, a plurality of actuators is selectively vibrated based on sound characteristics such as audio signal frequency or volume, thereby allowing the user to feel dynamic vibration.

While the embodiments of the present invention have been described herein, various changes can be carried out without departing the scope of the present invention. For example, music playback and game execution have been described as examples of applications in a mobile terminal according to embodiments of the present invention, but any function may be executed as long as sound is output. In addition, two actuators have been described as an example in the embodiments of the present invention, but the present invention is also applicable to two or more actuators and two or more actuators may have different response characteristics and may be of different types. Accordingly, the scope of the present invention is not limited to the description of the embodiments, but is defined by the accompanying claims and equivalents thereof.

What is claimed is:

1. An apparatus for generating vibration based on sound characteristics in a mobile terminal, the apparatus comprising:
   at least two actuators including first and second actuators for generating vibration;
   an actuator driver for driving the actuators to vibrate according to an actuator drive signal;
   an audio unit for converting audio data into an audio signal upon generation of a sound play request and outputting the audio signal to an audio output device; and
   a controller for determining whether to generate vibration according to whether a sound volume of the audio signal exceeds a reference sound volume, setting an actuator to be driven for the audio signal among the at least two actuators based on frequency distribution characteristics of the audio signal and a respective response time of each of the at least two actuators upon determining to generate the vibration, and generating the actuator drive signal for driving the set actuator to vibrate while the audio unit outputs the audio signal to the audio output device,
   wherein the response time of an actuator indicates a time taken for an intensity of vibration generated by driving of the actuator to reach a first predetermined vibration intensity from a second predetermined vibration intensity.

2. The apparatus of claim 1, wherein the first and second actuators are positioned at both ends with respect to a major axis of the mobile terminal in such a way that when a user holds the both ends of the mobile terminal with respect to the major axis, an intensity of vibration generated by the first actuator is at least two times as much as an intensity of vibration generated by the second actuator.

3. The apparatus of claim 1, further comprising a buffer for storing an audio signal,
   wherein the controller stores the audio signal in the buffer and, for each audio signal stored in the buffer, analyzes the sound volume of the audio signal.

4. The apparatus of claim 3, wherein the controller analyzes frequency distribution characteristics of the audio signal stored in the buffer.

5. The apparatus of claim 4, wherein based on the analysis result with respect to the frequency distribution characteristics of the audio signal stored in the buffer, the controller compares an amount of a frequency component of the audio signal that is greater than a predetermined reference frequency with an amount of a frequency component of the audio signal that is less than the predetermined reference frequency, and the controller sets an actuator for the audio signal stored in the buffer based on the results of the comparisons.

6. The apparatus of claim 1, wherein the at least two actuators include an actuator having faster response characteristics than a predetermined criterion, and the controller sets the actuator having faster response characteristics as an actuator to be driven, if the analysis result of the frequency distribution characteristics indicates that the frequency distribution characteristics have a high-frequency band and a narrow bandwidth.

7. The apparatus of claim 6, wherein the actuator having the faster response characteristics is an actuator having a response time of at most 10 ms, and the response time indicates a time taken for an intensity of vibration generated by driving of the actuator having the faster response characteristics to reach 50% of a maximum vibration intensity or to be reduced by 50% from the maximum vibration intensity.

8. The apparatus of claim 1, wherein if a volume of the audio signal is reduced by at least 50%, the controller forwards a break signal to the actuator driver to stop the actuators from generating vibration.

9. The apparatus of claim 1, wherein the at least two actuators include at least one of a vibration motor, a piezo, and an electroactive polymer.

10. A method of generating vibration based on sound characteristics in a mobile terminal, the method comprising:
    converting audio data into an audio signal upon generation of a sound play request;
    determining whether to generate vibration according to whether a sound volume of the audio signal exceeds a reference sound volume;
    setting, upon determining to generate the vibration, an actuator to be driven for the audio signal among at least two actuators based on frequency distribution characteristics of the audio signal and a respective response time of each of the at least two actuators, and generating an actuator drive signal for driving the set actuator; and
    driving the set actuator to vibrate according to the actuator drive signal while outputting the audio signal to an audio output device,
    wherein the response time of an actuator indicates a time taken for an intensity of vibration generated by driving of the actuator to reach a first predetermined vibration intensity from a second predetermined vibration intensity.

11. The method of claim 10, wherein determining whether to generate vibration based on the sound volume of the audio signal comprises:
    storing the audio signal in a buffer; and
    analyzing the sound volume of the audio signal stored in the buffer and determining to generate vibration for the audio signal stored in the buffer, if the sound volume of the audio signal is greater than the reference sound volume.

12. The method of claim 11, wherein setting the actuator to be driven for the audio signal among the at least two actuators based on the frequency distribution characteristics of the audio signal comprises:
    analyzing frequency distribution characteristics of the audio signal stored in the buffer;
    comparing an amount of a frequency component that is greater than a predetermined reference frequency with an amount of a frequency component that is less than the predetermined reference frequency; and
    setting an actuator for the audio signal stored in the buffer based on the results of the comparisons.

13. The method of claim 11, wherein setting the actuator to be driven for the audio signal among the at least two actuators based on the frequency distribution characteristics of the audio signal further comprises:
    setting an actuator having faster response characteristics as an actuator to be driven, if a result of analyzing the frequency distribution characteristics indicates that the frequency distribution characteristics have a high-frequency band and a narrow bandwidth.

14. The method of claim 10, further comprising forwarding a break signal to stop the actuators from generating vibration, if a volume of the audio signal is reduced by at least 50%.

* * * * *